Nov. 5, 1968 R. H. CAMPBELL 3,409,840
CONSTANT LEVEL, PHOTON CONTROLLED AMPLIFIER CIRCUIT
Original Filed Sept. 13, 1963
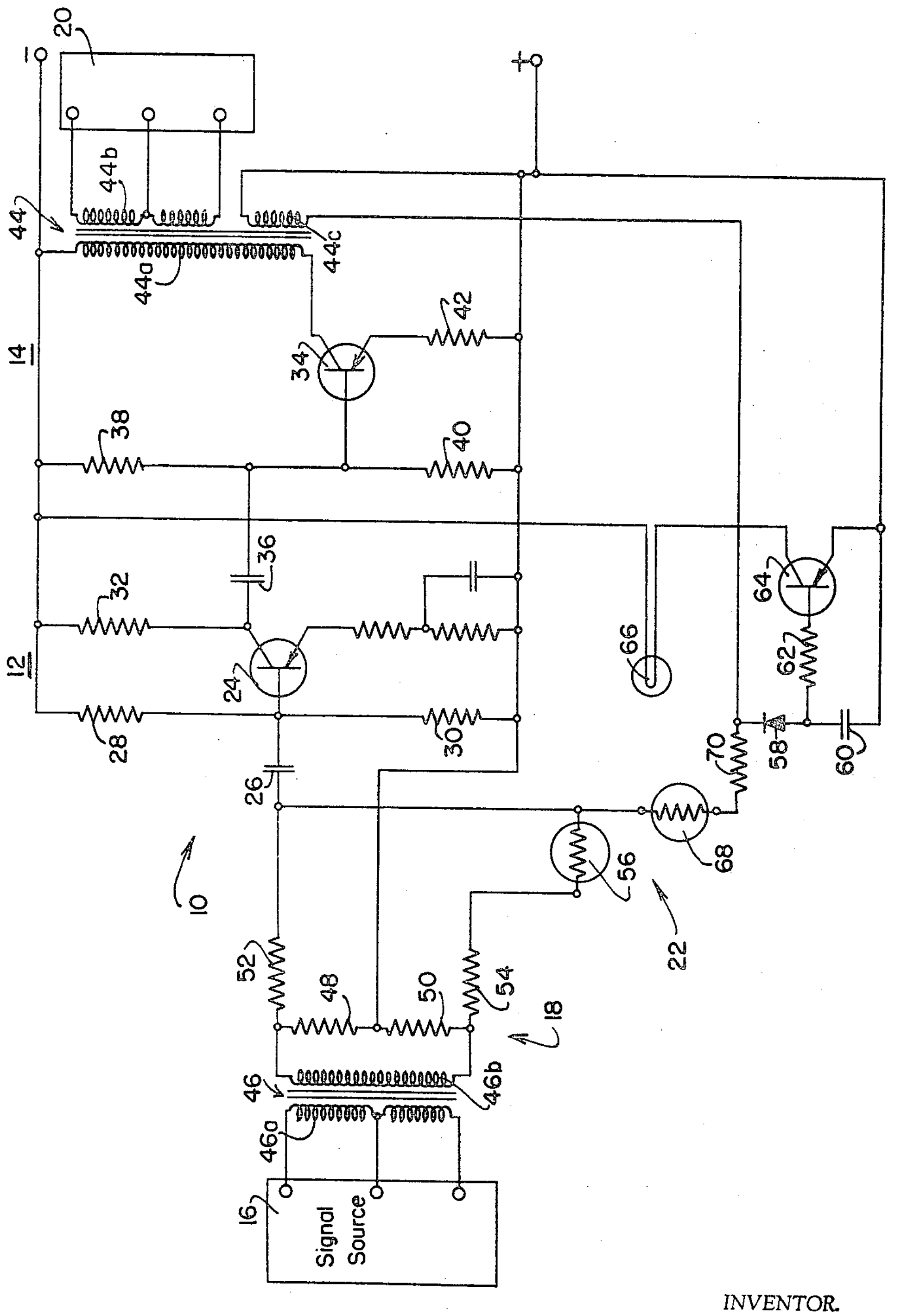
INVENTOR.
Richard H. Campbell
BY
Mason Kolehmainen Rathburn & Wyss.
Attys.

United States Patent Office 3,409,840
Patented Nov. 5, 1968

3,409,840

CONSTANT LEVEL, PHOTON CONTROLLED AMPLIFIER CIRCUIT

Richard H. Campbell, Rockford, Ill., assignor, by mesne assignments, to Webster Electric Company, Inc., Racine, Wis., a corporation of Delaware Continuation of application Ser. No. 308,700, Sept. 13, 1963. This application June 28, 1967, Ser. No. 650,168
5 Claims. (Cl. 330—59)

ABSTRACT OF THE DISCLOSURE

A normally unbalanced resistive bridge having one arm including a photoresistor and a constant value resistance connected in series couples a signal source to the input terminals of an amplifier. A secondary winding on the amplifier output transformer develops a signal proportional to the amplifier output signal, which signal is rectified by a diode and applied to a capacitor which is charged in accordance with the average value of the output signals. The capacitor is connected to control the gain of a transistor amplifier for energizing a lamp when the average value of the output signals exceed a predetermined level. Above this level the light acts on the photoresistor and tends to balance the bridge to achieve a compression action without substantially affecting the amplifier input impedance and without distortion. A second photoresistor, also controlled by the lamp, provides a negative feedback potential.

The present application is a continuation of application Ser. No. 308,700, filed Sept. 13, 1963, now abandoned.

This invention relates to an amplifier and, more particularly, to an amplifier including new and improved means for providing a substantially distortion-free, constant level output.

Many different circuits have been devised for controlling amplifiers using either vacuum tubes or solid state devices to provide a relatively constant amplitude output with a varying input signal. One technique commonly used includes the rectification of a portion of the amplifier output signal and the use of this rectifier signal as a variable bias for one or more stages in the amplifier. The use of a variable bias shifts the operating point on the characteristic curve of the controlled conduction device to vary the gain of the device with the result that the range of control must be sharply limited to avoid the introduction of distortion arising from operation of the device on a nonlinear portion of the characteristic.

In another prior circuit, a photoelectric or photoresistive device is shunted across the input or a subsequent stage of an amplifier to divert a portion of the input signal in accordance with varying illumination of the photoelectric device caused by the energization of a lamp in dependence on the level of the amplifier output signal. Although this approach has the advantage that the operating point of a controlled conduction device in the amplifier is not shifted, it has other disadvantages. If the shunting element is disposed in the amplifier input stage, the impedance variation produced by lighting the photoresistive element changes the reflected impedance into which the input or driving signal source works resulting in an impedance mismatch between the driving source and the amplifier input. Further, with photoresistive elements directly shunted across the input, the dark and fully illuminated impedance of the photoresistive element considered with regard to the impedance of the input components of the amplifier limits the range of control or compression that can be obtained and, thus, the range of variation in the input signal that can be accepted.

Accordingly, one object of the present invention is to provide a new and improved amplifier arrangement.

Another object is to provide an amplifier providing substantially distortion-free and constant amplitude output when supplied with an input signal varying over a wide range.

Another object is to provide an amplifier including new and improved photoelectric controlled means for controlling the amplifier output.

A further object is to provide an amplifier having a bridge circuit including a photoresistive element selectively illuminated by a lamp whose energization varies under the control of a rectified component of the amplifier output signal.

Another object is to provide an arrangement for controlling the output of an amplifier which includes a substantially constant impedance circuit connected to the input of the amplifier comprising a bridge network having a photoresistive element.

A further object is to provide a circuit for controlling the output of an amplifier which includes a pair of photoelectric or photoresistive elements controlled in accordance with the level of the amplifier output signal to provide differently timed controls on the level of the amplifier output.

A further object is to provide an arrangement for selectively providing a negative feedback potential in an output controlled amplifier in dependence on the level of illumination of a photoelectric or photoresistive element.

A further object is to provide an output control circuit for an amplifier including photoelectrically controlled means for controlling the level of the input signal supplied to the amplifier and the amount of negative feedback potential returned to this input.

In accordance with these and many other objects, one embodiment of the invention comprises an output controlled amplifier unit having input and output terminals. A bridge network including a photoresistive arm is coupled between the input terminals and a driving signal source, such as a source of audio frequency signals. To provide means for controlling the resistivity of the photoelectric or photoresistive element in the input bridge network, a portion of the output signal is derived from the output terminals of the amplifier and is applied across a rectifying network including a semiconductor or controlled conduction device. This rectified potential is amplified and applied to an electric lamp disposed in proximity to the photoresistive element. Thus, when the output of the amplifier rises above the point at which compression is to be initiated, i.e., the desired output level, a portion of the output potential is rectified and applied to the amplifier to control the illumination of the lamp. The input bridge network is initially in an unbalanced condition with the photoresistive element providing a relatively high dark impedance. When the lamp is energized at the compression point, the impedance of the photoresistive element is reduced to the point at which the bridge approaches a balanced condition. This reduces the amplitude of the signal applied to the input terminals of the amplifier and maintains the output level at the desired value.

The output control circuit for the amplifier also includes a second photoelectric or photoresistive element that is connected between the output terminals and the input terminal in a manner to provide a negative feedback potential. This photoresistive element can be selectively illuminated by the same lamp illuminating the photoresistive element in the input bridge network so that when the compression level is reached, the impedance of the second photoresistive element is reduced to permit the degenerative return of a portion of the output potential to the input. The response or attack time of this negative feedback circuit can be very small to provide means responding substantially instantaneously to an increase in the level of the input signal for producing a corresponding reduction in the level of the input signal and a consequent reduction in the output signal to the desired level.

Thus, the amplifier control circuit is capable of accepting a very wide range of input signal levels with only an insignificant increase in the output of the amplifier after the control or compression threshold value of the circuit has been reached. In addition, the circuit does not exert a gain control on the controlled conduction devices in the amplifier with the result that not only can large changes in signal level be accommodated without the introduction of distortion but also the internal design of the amplifier is freed from the restrictions on design inherently imposed by output level control techniques involving the operation of vacuum tube devices or semiconductor devices on different points of the operating characteristic. Further, even though the output level control is exerted at least in part on the input signal supplied to the input of the amplifier, this is accomplished without introducing a change in the impedance of the amplifier reflected to the driving signal source.

Many other objects and advantages of the present invention will become apparent from considering the following detailed description in conjunction with the drawing which comprises a schematic circuit diagram of an output level controlled amplifier embodying the present invention.

Referring now more specifically to the drawing, therein is illustrated an amplifier circuit indicated generally as 10 which embodies the present invention and which includes a pair of capacitively coupled amplifier stages 12 and 14. The input amplifier stage 12 is coupled to a driving signal source 16 through a bridge network indicated generally as 18, and the output amplifier stage 14 is coupled to a signal utilizing device 20. A photoelectric control circuit indicated generally as 22 controls the operation of the amplifier stages 12 and 14, preferably by controlling the level of the input signal applied to the stage 12, so that a substantially constant amplitude and distortion-free signal is supplied to the utilizing device 20 even though the amplitude of signals supplied by the signal soure 16 varies over a relatively wide range.

The input amplifier stage 12 includes a transistor 24 having a base electrode which is coupled to the input bridge network 18 through a coupling capacitor 26 and which is provided with an operating bias by a voltage dividing network including a pair of resistance elements 28 and 30 connected between negative and positive potential sources, such as a negative potential source of a nominal 24 volts and a positive source of a nominal 24 volts. The amplified signal appearing across a collector resistance element 32 is coupled to the base of a transistor 34 in the output stage 14 of the amplifier through a capacitor 36, the base of the transistor 34 being provided with a biasing potential by a voltage dividing network including a pair of resistance elements 38 and 40 connected between the potential supplies. The emitter of the transistor 34 in the output stage 14 is connected to the positive potential source through a resistance element 42, and the collector of the transistor 34 is connected to the negative potential source through a primary winding 44a of an output transformer 44. A first center-tapped secondary winding 44b of an output transformer 44 is connected to the load or utilization means 20.

To provide means for driving the input amplifier stage 12, this stage is coupled to the output of a signal source 16 through the bridge network 18 and a transformer 46 having a center-tapped primary winding 46a connected to the output of the signal source 16 and a secondary winding 46b coupled to the bridge network 18. The bridge network includes four arms, three of which comprise three resistance elements 48, 50 and 52. The fourth arm of the bridge includes a resistance element 54 connected in series with a photoelectric, photosensitive, or photoresistive element 56. The input potential from the source 16 is applied to the bridge network 18 in parallel with the series connected arms 48, 50 and 52, 54, 56 by connecting the terminals of the secondary winding 46b to the common points of the resistance elements 48 and 52 and the resistance elements 50 and 54. The opposite diagonal of the bridge network 18 is connected to the positive potential supply and one terminal of the capacitor 26. In its normal or dark condition, the photoresistive element 56 is in its high impedance state so that bridge network 18 is in an unbalanced condition in which substantially all of the input signal, such as an audio frequency signal, is coupled through the capacitor 26 to the base electrode of the transistor 24. Alternatively, when the photoresistor 56 becomes fully illuminated so that its impedance or resistance is reduced to a low value, the bridge network 18 approaches a balanced condition in which a very small signal is supplied through the capacitor 26 to the base of the transistor 24.

The control circuit 22 controls the illumination of the photoresistive element 56 and, thus, the proportion of the input signal supplied by the source 16 that is supplied to the input stage 12 of the amplifier. To accomplish this, the output transformer 44 connected to the output stage 14 of the amplifier includes an additional secondary winding 44c across which is developed a signal proportional to the magnitude of the output signal from the amplifier which is 180° out of phase with respect to the input signal applied to the base of the transistor 24. One terminal of the secondary winding 44c is connected to the positive potential source, and the other terminal is connected to the cathode of a rectifier 58.

During the negative-going half cycles of the alternating current signal developed in the output transformer 44, the rectifier 58 is placed in a conductive condition to charge a capacitor 60 to a negative potential dependent on the level of the signal at the output stage 14. The charge across the capacitor 60 is forwarded through a base resistance element 62 to the base of a transistor 64, the emitter of which is connected directly to the positive potential supply. The collector of the transistor 64 is connected through the filament of an electric lamp 66 to the negative potential supply.

The winding 44c is so proportioned that when the level of the output signal from the stage 14 approaches to the point at which the output of the amplifier is to be maintained, the potential supplied by the winding 44c to the rectifier 58 exceeds its conduction threshold and the capacitor 60 begins to charge. After a time delay determined by the time constants of the circuit charging the capacitor 60, the potential on this capacitor reaches a point at which the base of the transistor 64 is negative with respect to its emitter so that the transistor 64 is placed in a conductive condition to variably energize or illuminate the lamp 66. The light from the lamp 66 impinges on the photoresistive or photoelectric element 56 to reduce the impedance of this element. The reduction of the resistance of the element 56 tends to bring the bridge 18 toward a balanced condition and, in doing so, reduces the magnitude or level of the audio frequency signals coupled through the capacitor 26 to the base of the input transistor 24. Thus the level of the output signal supplied by the output stage 14 of the amplifier is correspondingly reduced. As the photoelectric element 56 becomes fully illuminated, the bridge network 18 approaches a balanced condition in which the magnitude of the signal supplied to the transistor 24 is greatly reduced.

Since the reduction in the resistance of the photoresistive element 56 occasioned by the illumination of the lamp 66 is dependent on or controlled by a rectified component of the output signal developed in this secondary winding 44*c*, the level of the input signal applied to the input stage 12 is controlled in accordance with the average level of the output signal developed by the output stage 14 and not the instantaneous value thereof. In a typical application, the attack time of the control circuit 22, i.e., the time elapsed between a large increase in the input signal from the signal source 16 and the attainment of the breakover level of potential of the diode 58 which sets the compression point at which the transistor 64 illuminates the lamp 66 to reduce the input signal supplied to the base of the transistor 24, is only 20 milliseconds with a release time on the order of one second. This very small attack time in which the control circuit 22 controls the bridge network 18 to shift from zero to full compression is made possible, in part, by the gain realized in the transistor 64 which serves as an amplifier for the electrical lamp 66. This attack time can be further reduced by supplementing the illustrated filamentary lamp 66 with a gaseous discharge lamp, such as a neon lamp. In one circuit constructed in accordance with the present invention, the amplifier 10 provides a gain of 14 db with around 1% distortion, and this is realized with only 1 db change in the level of the output signal from the amplifier stage 14 with a 35 db change in the level of the input signal. Further, this control over the output level in the amplifier stage 14 is accomplished without any substantial variation in the 600 ohm input impedance of the amplifier.

The performance of the amplifier circuit 10 is further enhanced by the provision of means for returning a small amount of degenerative or negative feedback potential from the output stage 14 to the input stage 12. More specifically, the control means 22 includes a second photoelectric or photoresistive element 68 that is connected in series with a resistance element 70 between one terminal of the input coupling capacitor 26 and one terminal of the feedback or control winding 44*c*. As set forth above, the winding 44*c* supplies a signal 180° out of phase with the input signal supplied to the base of the transistor 24. In the normal condition of the circuit 10, the lamp 66 is not illuminated, and the photoresistive element 68 is in its high impedance or dark state so that an insignificant amount of negative feedback to the base of the transistor 24 occurs. However, when the threshold level of the circuit has been exceeded and the transistor 64 is placed in a conductive condition indicating that the average value of the output level has exceeded the compression threshold, the lamp 66 illuminates the photoresistive element 68 in addition to the photoresistive element 56 and reduces the impedance of the feedback loop. Thus, any instantaneous increases in the level of the output signal to which the response of the bridge network 18 is delayed result in virtually simultaneous increases in the value of the negative feedback potential. This produces a corresponding reduction in the value of the input signal supplied to the transistor 24 so as to maintain the level of the output signal at the desired compression level. This negative feedback potential also has the usual advantage of reducing the distortion of the output signal. In amplifiers 10 constructed in accordance with the present invention in which the second photoresistive device 68 is employed, it is possible to obtain distortion levels on the order of ½ of 1% with a 45 db change in the level of the input signal.

Although the present invention has been described with reference to a single illustrative embodiment thereof, it should be understood that numerous other modifications and embodiments can be devised by those skilled in the art that will fall within the spirit and scope of the principles of this invention.

What is claimed as new and desired to be secured by Letters Patent of the United States is:

1. A feedback controlled compressor amplifier circuit for use with a source of alternating signals comprising: an amplifier having a pair of input terminals and a pair of output terminals, a bridge network including four resistive arms joined at first and second pairs of bridge terminals, said pairs of bridge terminals being connected respectively to the signal source and to said amplifier input terminals, one of said arms including a photoresistive element serving to unbalance said bridge network in the absence of light and tending to balance said bridge network as the light level increases, a lamp disposed to illuminate said photoresistive element, a lamp amplifier connected to said lamp for energizing said lamp and having an input circuit, and a control circuit for controlling the operation of said lamp amplifier, said control circuit including a rectifier and a capacitor connected in series across said amplifier output terminals for developing a D.C. voltage proportional to the average value of the amplifier output signal, and means connecting the common junction of said rectifier and said capacitor to said input circuit of said lamp amplifier for operating said lamp amplifier at a level determined by said D.C. voltage.

2. The amplifier circuit of claim 1, said one aım of said bridge network including a constant value resistance in series with said photoresistive element for confining the impedance variations within said bridge circuit to a predetermined range.

3. A constant output amplifier circuit for use with a a signal source comprising an amplifier having an input and an output, first light sensitive means for coupling a selected part of the signal from the signal source to the input of the amplifier, second light sensitive means for controlling the application of a negative feedback potential from the output of the amplifier to the input of the amplifier, light means for variably illuminating the first and second light sensitive means, and control means controlled in accordance with the level of the signal at the output of the amplifier for controlling the energization of the light means in dependence on the average level of the signal at the output of the amplifier.

4. An amplifier control circuit for use with an audio frequency signal source comprising an amplifier having input and output terminals, a bridge network connecting the signal source to the input terminals, said bridge network including a first photoresistive element in an arm thereof, circuit means including a second photoresistive element for returning a portion of the amplified signal to the input of the amplifier in an out of phase relation, lamp means for variably illuminating the first and second photoresistive elements, a rectifying network including filter means responsive to the signal appearing at the output terminals, and amplifier means controlled by the rectifying network for controlling the illumination of the first and second photoresistive means by the lamp means.

5. A feedback controlled compressor amplifier circuit for use with a source of alternating signals comprising: an amplifier having a pair of input terminals and a pair of output terminals, a bridge network including four resistive arms joined at first and second pairs of bridge terminals, said pairs of bridge terminals being connected respectively to the signal source and to said amplifier input terminals, one of said arms including a photoresistive element serving to unbalance said bridge network in the absence of light and tending to balance said bridge network as the light level increases, a lamp disposed to illuminate said photoresistive element, a lamp amplifier connected to said lamp for energizing said lamp and having an input circuit, and a control circuit connected to the amplifier output for controlling the operation of said lamp amplifier and including a rectifier and a capacitor connected in series for developing a D.C. voltage proportional to the amplifier output signal, and means connecting said control circuit to said lamp amplifier input circuit for operating said lamp amplifier at a level determined by said D.C. voltage.

References Cited

UNITED STATES PATENTS

| | | | |
|---|---|---|---|
| 3,002,099 | 9/1961 | Gregory et al. | 250—210 |
| 3,014,135 | 12/1961 | Hewlett et al. | 250—210 |
| 3,248,642 | 4/1966 | Rothschild | 330—59 |
| 3,258,707 | 6/1966 | Lawrence | 330—59 |

NATHAN KAUFMAN, *Primary Examiner.*